US008796766B2

(12) United States Patent
Cho

(10) Patent No.: US 8,796,766 B2
(45) Date of Patent: Aug. 5, 2014

(54) SEMICONDUCTOR DEVICE AND METHOD FOR FABRICATING THE SAME

(75) Inventor: Cheol Ho Cho, Seoul (KR)

(73) Assignee: Dongbu HiTek Co., Ltd., Seoul (KR)

( * ) Notice: Subject to any disclaimer, the term of this patent is extended or adjusted under 35 U.S.C. 154(b) by 42 days.

(21) Appl. No.: 13/438,620

(22) Filed: Apr. 3, 2012

(65) Prior Publication Data

US 2013/0093014 A1    Apr. 18, 2013

(30) Foreign Application Priority Data

Oct. 14, 2011    (KR) .......................... 10-2011-0105253

(51) Int. Cl.
*H01L 21/8249*    (2006.01)
*H01L 27/06*    (2006.01)

(52) U.S. Cl.
CPC ........ *H01L 21/8249* (2013.01); *H01L 27/0623* (2013.01)
USPC ............ 257/337; 257/343; 438/236; 438/286

(58) Field of Classification Search
CPC ................ H01L 27/06; H01L 21/8249; H01L 29/66681; H01L 29/7816; H01L 29/7824
USPC ................... 257/337, 357, 343; 438/236, 286
See application file for complete search history.

(56) References Cited

U.S. PATENT DOCUMENTS

| 6,365,932 | B1 * | 4/2002 | Kouno et al. ................. 257/341 |
| 6,747,294 | B1 * | 6/2004 | Gupta et al. .................. 257/127 |
| 8,227,871 | B2 * | 7/2012 | Ko ................... 257/370 |
| 8,324,713 | B2 * | 12/2012 | Chen et al. ..................... 257/593 |
| 2002/0017697 | A1 * | 2/2002 | Kitamura et al. ............. 257/492 |
| 2007/0075363 | A1 | 4/2007 | Otake et al. |
| 2009/0020812 | A1 * | 1/2009 | Cheng .......................... 257/342 |
| 2009/0090981 | A1 * | 4/2009 | Natsuaki ....................... 257/408 |

FOREIGN PATENT DOCUMENTS

| JP | 2009-105374 | 7/2008 |
| KR | 100134847 | 1/1998 |
| KR | 10-2007-0035435 | 3/2007 |

* cited by examiner

*Primary Examiner* — Matthew Landau
*Assistant Examiner* — Damon Hillman
(74) *Attorney, Agent, or Firm* — Sherr & Jiang, PLLC

(57) ABSTRACT

A semiconductor device includes a laterally double diffused metal oxide semiconductor (LDMOS) transistor formed on a partial region of a epitaxial layer of a first conductive type, a bipolar transistor formed on another partial region of the epitaxial layer of the first conductive type, and a guard ring formed between the partial region and the another partial region. The guard ring serves to restrain electrons generated by a forward bias operation of the LDMOS transistor from being introduced into the bipolar transistor.

8 Claims, 7 Drawing Sheets

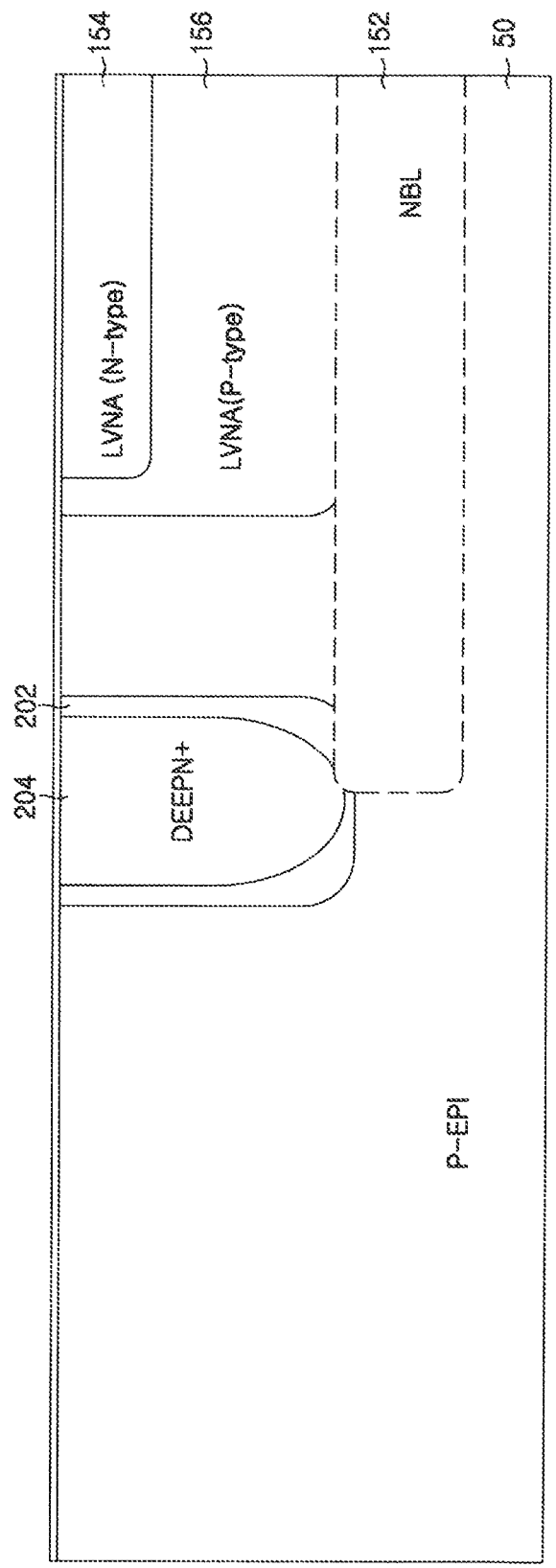

SEMICONDUCTOR DEVICE AND METHOD FOR FABRICATING THE SAME

The present application claims priority under 35 U.S.C. 119 and 35 U.S.C. 365 to Korean Patent Application No. 10-2011-0105253 (filed on Oct. 14, 2011), which is hereby incorporated by reference in its entirety.

BACKGROUND

In general, a power amplifier can be made by selecting and incorporating at least one of a bipolar transistor, a laterally double diffused metal oxide semiconductor (LDMOS) transistor, and a field effect transistor (FET), depending on desired use. The linearity, efficiency, maximum output power, and performance have improved for such devices in relation to cost. Current drift problems due to the required high power of an LDMOS transistor and the reliability of a power transistor have remarkably improved over time, making LDMOS transistors more desirable in power amplifiers.

Devices which are operable at high voltages that are close to a theoretical breakdown voltage of a semiconductor may be preferred in power semiconductor devices. Accordingly, when an external system using relatively high voltages is controlled by an integrated circuit, the integrated circuit may require a device for high voltage control which should have a structure accommodating a high breakdown voltage. For example, the drain or source of a transistor may receive a relatively high voltage from an external system. A punch through voltage between the drain and source and the semiconductor substrate and a breakdown voltage between the drain and source and a well or substrate should be higher than the relatively high voltage of the external system. Accordingly, BiCMOS power semiconductor devices in which a bipolar transistor and an LDMOS transistor are combined may be appropriately employed as a power semiconductor device.

Example FIG. 1 illustrates a structure of a BiCMOS power semiconductor device in accordance with the related art. A BiCMOS power semiconductor device may be formed on epitaxial layer 10 having a first conductive type. An LDMOS transistor may be formed on a partial region (hereinafter referred to as first region 20) in epitaxial layer 10. A bipolar transistor may be formed on another partial region (hereinafter referred to as second region 50).

First region 20 may include high-voltage well 22 of a second conductive type formed in a partial region within the epitaxial layer 10. First region 20 may include gate pattern 25 overlapping field oxide film 24. First conductive type body 28 may be formed at one side of the gate pattern 25 within high-voltage well 22 of the second conductive type and source region 30 formed within first conductive type body 28. Low-voltage well 32 of the second conductive type including drain region 34 may be formed at another side of gate pattern 25. A LDMOS transistor having an example structure illustrated in FIG. 1 may be formed at the first region 20 and may be separated from a bipolar transistor formed at second region 50, separated by the field oxide film 24.

Second region 50 may include at least one of: (1) Buried layer (NBL) 52 of the second conductive type formed within epitaxial layer 10. (2) A high-voltage well 54 of the second conductive type may be formed within the epitaxial layer 10 over buried layer 52 of the second conductive type. (3) Deep sink region 58 of the second conductive type may be connected to one side of buried layer 52 of the second conductive type and may have collector region 56. (4) First conductive type well 60 may be formed within the high-voltage well 54 of the second conductive type. (5) Base region 62 and emitter region 64 may be formed within first conductive type well 60.

Collector region 56 and emitter region 64 may be formed by implantation of second conductive type impurity ions. Base region 62 may be formed by implantation of first conductive type impurity ions.

In the BiCMOS power semiconductor device illustrated in example FIG. 1, when the LDMOS transistor is forward biased at a junction between drain region 34 and semiconductor substrate, electrons moves toward deep sink region 58 of the second conductive type connected to collector region 56. These electrons may cause noise in the bipolar transistor, thereby lowering reliability of the semiconductor device.

SUMMARY

Embodiments relate to a semiconductor device and a fabricating method thereof which may be capable of substantially blocking electrons generated from a laterally double diffused metal oxide semiconductor (LDMOS) transistor and preventing electrons generated from an emitter region of a bipolar transistor from being moved in a vertical direction. Embodiments include the addition of a guard ring between a region occupied by the LDMOS transistor and a region occupied by the bipolar transistor. Embodiments relate to a semiconductor device and a fabricating method thereof capable of blocking electrons generated from an LDMOS transistor by virtue of the addition of a guard ring between a region occupied by the LDMOS transistor and a region occupied by a bipolar transistor.

Embodiments relate to a semiconductor device and a fabricating method thereof capable of preventing electrons from moving in a vertical direction and allowing the electrons to move in a lateral direction. Electrons may be allowed to move in the lateral direction by providing a collector region and an emitter region within a first conductive extension region, in accordance with embodiments. The first conductive extension region may not be connected to a second conductive buried layer. In embodiments, a second conductive extension region may have a contact surface with the second conductive buried layer and is connected to the first conductive extension region.

Embodiments relate to a semiconductor device and a fabricating method thereof capable of preventing electrons from moving in a vertical direction by providing a collector region and an emitter region within the extension region. In embodiments, the extension region may be formed to have a first conductive type which is not connected to a buried layer of a second conductive type. In embodiments, a well junction of the first conductive type may be formed below the emitter region.

In embodiments, a semiconductor device includes at least one of: (1) A laterally double diffused metal oxide semiconductor (LDMOS) transistor formed on a partial region of an epitaxial layer of a first conductive type. (2) A bipolar transistor formed on another partial region of the epitaxial layer of the first conductive type. (3) A guard ring formed between the partial region and the another partial region, where the guard ring may restrain electrons generated by a forward bias operation of the LDMOS transistor from being introduced into the bipolar transistor.

In embodiments, a guard ring may include at least one of: (1) A high-voltage well of a second conductive type, which is the opposite conductive type than the first conductive type. (2) A second conductive deep sink region formed within the high-voltage well of the second conductive type. (3) An N-type impurity layer formed within the second conductive deep sink region.

In embodiments the bipolar transistor may include at least one of: (1) A buried layer of the second conductive type connected to the guard ring. (2) An extension region of the first conductive type having a contact surface with the buried layer of the second conductive type, where the extension region of the first conductive type may be formed through an ion implantation of the first conductive type impurity. (3) An extension region of the second conductive type formed within the first conductive extension region and having a collector region and an emitter region. (4) A base region formed between the guard ring and the extension region of the first conductive type. In accordance with embodiments, the bipolar transistor may include a well junction of the first conductive type formed below the emitter region and connected to the extension region of the first conductive type. The emitter region and the collector region may be formed isolated by a distance of about 2.5 μm~3.5 μm, in accordance with embodiments. In embodiments, the bipolar transistor may include a well of the first conductive type formed below the base region. In embodiments, the extension region of the first conductive type and the extension region of the second conductive type may be formed by a drive-in process.

In embodiments, a method for fabricating a semiconductor device having a laterally double diffused metal oxide semiconductor (LDMOS) transistor and a bipolar transistor may include at least one of: (1) Forming an epitaxial layer of a first conductive type on a semiconductor substrate. (2) Implanting impurity ions of the second conductive type into a partial region of the epitaxial layer of the first conductive type in which the bipolar transistor is to be formed to form a buried layer of a second conductive type (i.e. opposite to the first conductive type). (3) Forming a guard ring connected to an upper region of one side of the buried layer of the second conductive type. (4) Implanting impurity ions of the second conductive type into a partial region of an upper portion of the second conductive buried layer to form a extension region of the first conductive type, wherein the first conductive extension region has a contact surface with the second conductive buried layer. (5) Forming an extension region of the second conductive type within the extension region of the first conductive type through the second conductive type impurity ion implantation process. (6) Implanting impurity ions of the first conductive type into a partial region within the extension region of the second conductive type and a region between the guard ring and the extension region of the first conductive type to form a well junction of the first conductive type and a well of the first conductive type. (7) Implanting impurity ions of the second conductive type to form an emitter region within the first conductive well junction and a collector region within the second conductive extension region, the collector region being isolated from the emitter region by a preset distance. (8) Implanting impurity ions of the first conductive type into the well of the first conductive type to form a base region within the well of the first conductive type.

In embodiments, the forming of a guard ring includes at least one of: (1) Forming a high-voltage well of the second conductive type connected to the second conductive buried layer through the second conductive impurity ion implantation process. (2) Forming a second conductive deep sink region within the high-voltage well of the second conductive type. (3) Forming an impurity layer of the second conductive type within the deep sink region of the second conductive type to form the guard ring.

The collector region may be formed to be isolated from the emitter region by a distance of about 2.5 μm~3.5 μm, in accordance with embodiments. In embodiments, the well junction of the first conductive type may be formed such that a portion of the well junction of the first conductive type is connected to the extension region of the first conductive type.

The above objects of embodiments and other objects that are not described above are not limited thereto and will be apparently understood by those skilled in the art from the following description.

BRIEF DESCRIPTION OF THE DRAWINGS

The above and other objects and features of embodiments will become apparent from the following description of embodiments, given in conjunction with the accompanying drawings, in which:

FIGS. 4A to 4C are cross sectional views illustrating a process of forming an NPN transistor in a BiCMOS power semiconductor device, in accordance with embodiments.

DETAILED DESCRIPTION

Figure 1:
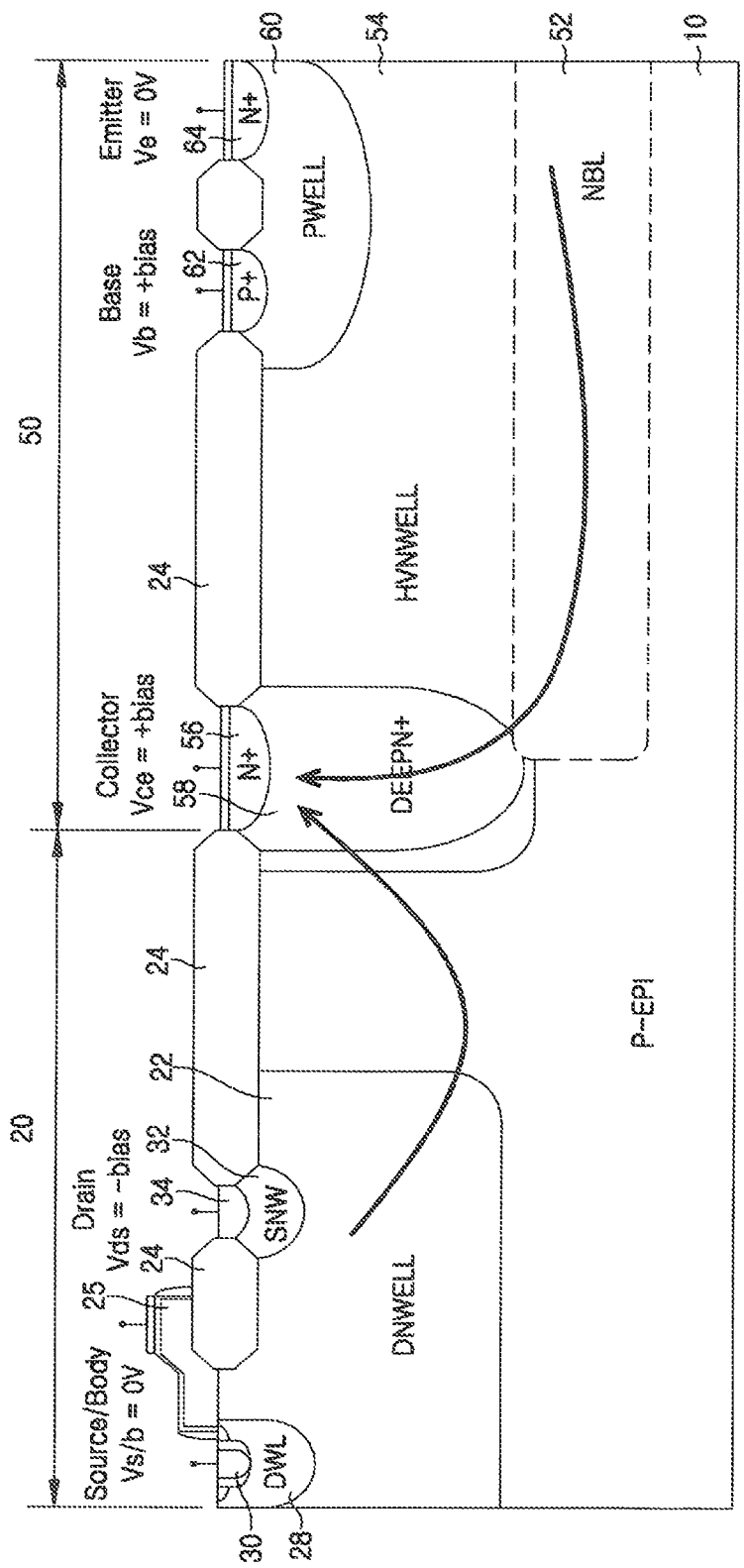
FIG. 1 is a cross sectional view illustrating a structure of a BiCMOS power semiconductor device, in accordance with the related art.

The advantages and features of embodiments and methods of accomplishing these will be clearly understood from the following described embodiments taken in conjunction with the accompanying drawings. However, embodiments are not limited to those embodiments and may be implemented in various forms. It should be noted that the present embodiments are provided to make a full disclosure and also to allow those skilled in the art to know the full range of the embodiments. Therefore, embodiments are to be defined only by the scope of the appended claims. Further, like reference numerals refer to like elements throughout the specification.

Figure 2:
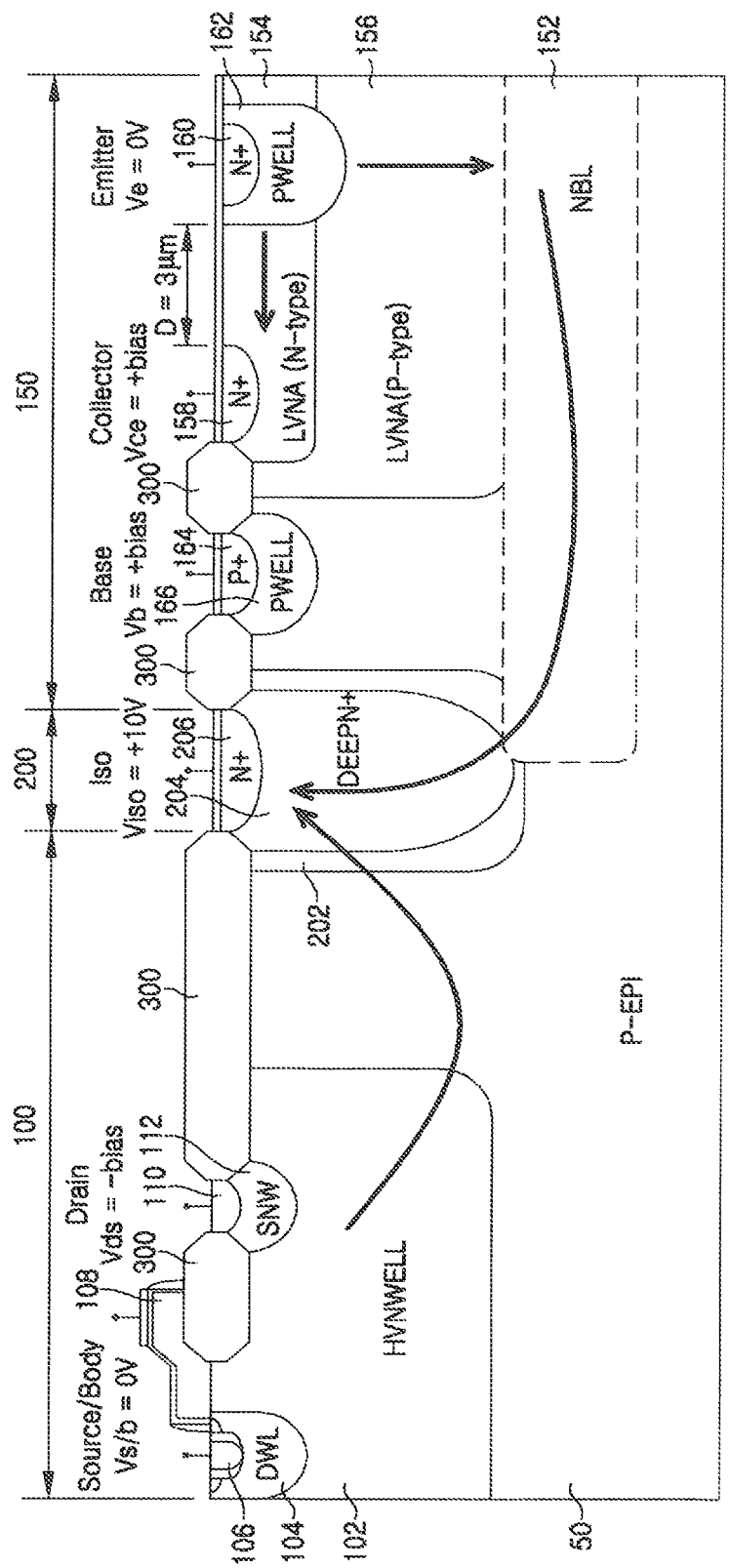
FIG. 2 is a cross sectional view illustrating a structure of a BiCMOS power semiconductor device, in accordance with embodiments.

Embodiments relate to an LDMOS device and a fabricating method thereof. FIG. 2 is a sectional view illustrating a BiCMOS power semiconductor device, in accordance with embodiments. A BiCMOS power semiconductor device in accordance with embodiments may be formed on epitaxial layer 50 of a first conductive type. Epitaxial layer 50 may include first region 100 having an LDMOS transistor and second region 150 having a bipolar transistor (e.g. an NPN transistor), in accordance with embodiments. Epitaxial layer 50 may include third region 200 having a guard ring, in accordance with embodiments. In embodiments, the guard ring may be formed for guarding or substantially preventing electrons generated by the LDMOS transistor to move toward the NPN transistor.

In embodiments, the first conductive type may refer to P-type of impurity ions and the second conductive type may refer an N-type of impurity ions. The polarity of the first conductive type and the second conductive type are opposite to each other.

A LDMOS transistor in first region 100 may include high-voltage well of the second conductive type (HVNWELL) 102 formed in a portion of epitaxial layer 50 grown on a semiconductor substrate, in accordance with embodiments. A LDMOS transistor in first region 100 may include source region 106 formed within the first conductive type body (DWL) 104. A LDMOS transistor in first region 100 may include gate pattern 108 and drain region 110. A LDMOS transistor may include second conductive type well (SNW) 112 formed below drain region 110. Source region 106 may be formed at one side of gate pattern 108 and within first conductive type body 104. Drain region 110 may be formed at another side of gate pattern 108 and within second conductive type well 112.

In embodiments, an NPN transistor may be formed to have a lateral direction operational structure. For example, an NPN transistor may include first extension region 154 of the second conductive type. First extension region 154 is not connected to a buried layer (NBL) 152 of the second conductive type. Buried layer 152 is connected to a guard ring, in accordance with embodiments. An NPN transistor may include second extension region (LVNA) 156 of the first conductive type, in accordance with embodiments. First extension region 154 may be formed to be within second extension region (LVNA) 156. Second extension region 156 may have a contact surface with buried layer 152 of the second conductive type. An NPN transistor may include collector region 158 and emitter region 160, both formed within the first extension region 154, in accordance with embodiments. Well junction (PWELL) 162 of the first conductive type may be formed below emitter region 160. Base region 164 may be formed between the guard ring and collector region 158. First conductive type well 166 may be formed below base region 164.

First extension region 154 and second extension region 156 may be formed through a drive-in process using one ion implantation mask, in accordance with embodiments. As an example drive-in process, an ion implantation mask may be formed to open an upper portion of epitaxial layer 50 corresponding to first extension region 154 and second extension region 156. Then, a first conductive type impurity ion implantation process may be executed, followed by a second conductive type ion implantation process.

In embodiments, an NPN transistor may enable substantially blocking a vertical current through the use of first extension region 154, second extension region 156, and the well junction 162 of the first conductive type formed below emitter region 160. In embodiments, electrons generated from emitter region 162 may flow in a vertical direction and a lateral direction. Electrons flowing in the vertical direction may be coupled to holes within well junction 162 of the first conductive type and second extension region 156, which may substantially block the flow of current in the vertical direction. In embodiments, emitter region 160 may be formed within well junction 162 of the first conductive type to lower current flowing in the vertical direction lower, thus substantially contributing or ensuring the isolation of the NPN transistor.

Collector region 158 and emitter region 160 may be formed within first extension region 154 with a certain distance (D), in accordance with embodiments. In embodiments, a distance D may be approximate 3 μm, although those of ordinary skill in the art may appreciate other distances. In embodiments, collector region 158 and emitter region 160 may be formed through an implantation process of second conductive type impurity ions, implanted with a relatively high concentration. Base region 164 may be formed through an implantation process of first conductive type impurity ions with a relatively high concentration into first conductive type well 166.

In embodiments, a guard ring may be formed in third region 200. A guard ring may include deep sink region 204 of the second conductive type within second conductive type well 202, in accordance with embodiments. In embodiments, second conductive type well 202 may have a relatively high concentration of impurity ions implanted. In embodiments, a guard ring may include impurity layer 206 of the first conductive type formed within deep sink region 204 of the second conductive type. A guard ring in third region 200, base region 164, and first extension region 154 may be isolated by different portions of field oxide film 300, in accordance with embodiments. In embodiments, an LDMOS transistor in first region 100 and a guard ring in third region 200 may also be isolated by field oxide film 300.

In a BiCMOS power semiconductor device in accordance with embodiments, isolation voltage Viso may be applied to a guard ring, base voltage Vb may be applied to base region 164, collector voltage Vce may be applied to collector region 158, and emitter voltage Ve may be applied to emitter region 160.

An example operation of a BiCMOS power semiconductor device having will be described, in accordance with embodiments. Voltage Vds with a minus (−) bias may be applied to drain region 110 of a LDMOS transistor. A voltage of 0V may be applied as source voltage Vs/b. An isolation voltage Viso of 10V may be applied to a guard ring. A bias voltage may be applied to base region 164 and collector region 158. A voltage of 0V may be applied to emitter region 160. Under these example voltage inputs, a forward bias operation may be performed at a junction between drain region 110 of the LDMOS transistor and the semiconductor substrate to trigger movement of electrons, in accordance with embodiments. The electrons may be restrained by the guard ring so that the electronics do not affect or substantially do not affect the NPN transistor formed within second region 150.

Electrons generated from emitter region 160 in the NPN transistor may move toward collector region 158 to which the bias voltage is applied, in accordance with embodiments. During the movement of electrons, a portion of the electrons generated from emitter region 160 may move in a vertical direction. The portion of electrons moved in the vertical direction are at least partially blocked by well junction 162 of the first conductive type formed below the emitter region 160.

Figure 3A:
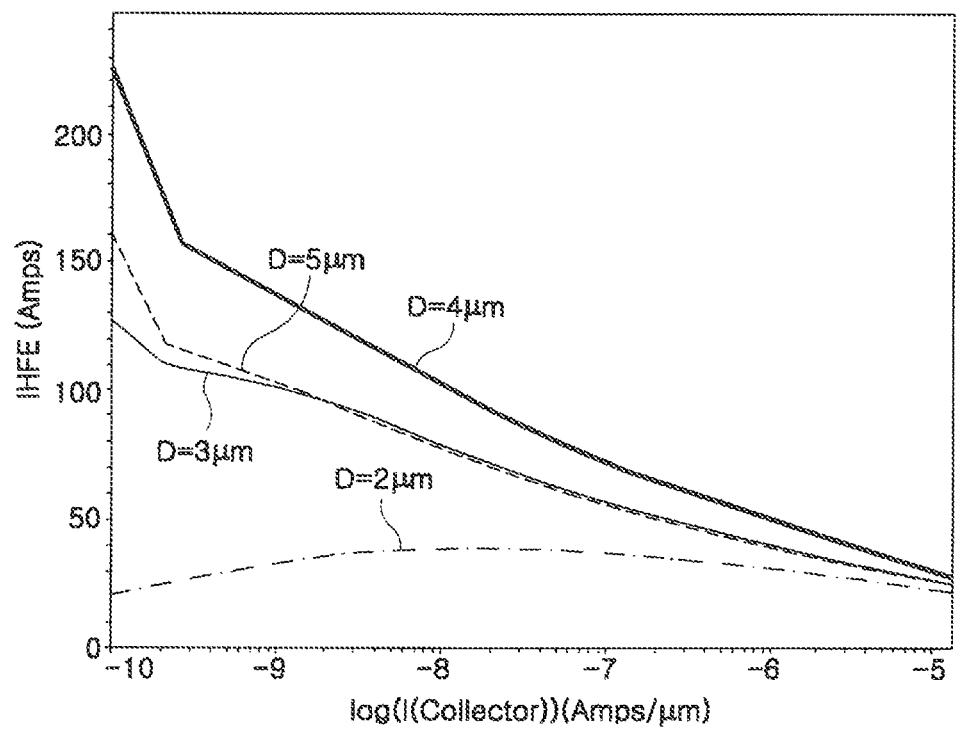
FIG. 3A is a graph illustrating a lateral current gain Hfe obtained by varying a distance (D) isolated between an emitter region and a collector region of an NPN transistor when the isolation voltage Viso applied to a guard ring is 10 V, in accordance with embodiments.
Figure 3B:
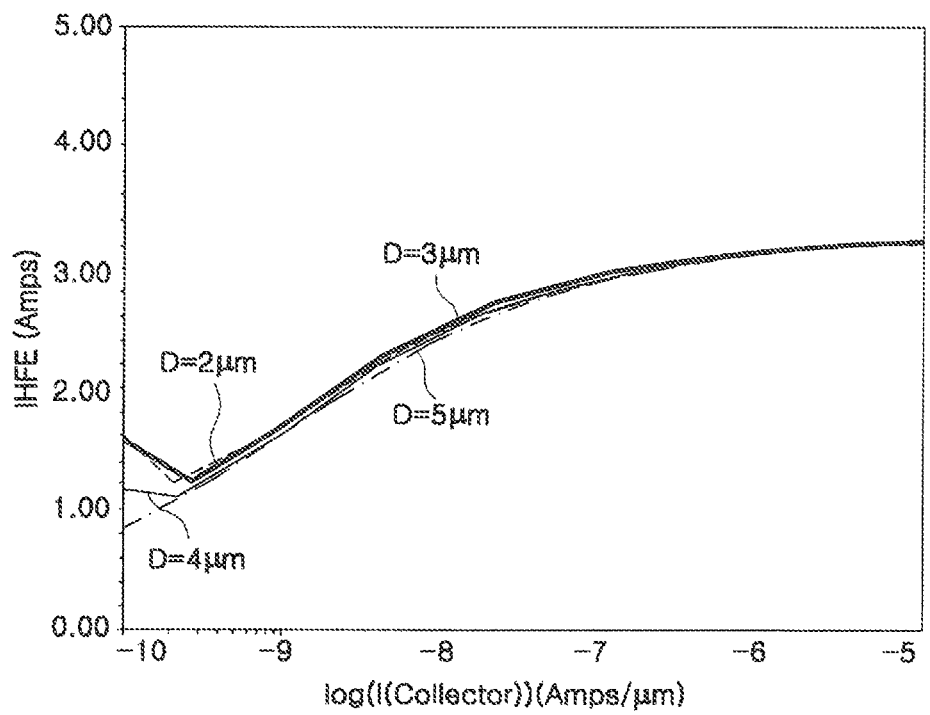
FIG. 3B is a graph illustrating a vertical current gain Hfe obtained by varying a distance (D) isolated between the emitter region and the collector region of the NPN transistor, in accordance with embodiments.

Current gains Hfe measured in a NPN transistor of an example BiCMOS power semiconductor device are illustrated in FIGS. 3A to 3D, in accordance with embodiments. FIG. 3A shows lateral current gains Hfe obtained by varying a distance (D=2 μm, 3 μm, 4 μm, and 5 μm) of isolation between emitter region 160 and collector region 158 of the example NPN transistor, when an isolation voltage Viso of 10V is applied to the guard ring, in accordance with embodiments. FIG. 3B shows vertical current gains Hfe obtained by varying a distance (D=2 μm, 3 μm, 4 μm, and 5 μm) of isolation between emitter region 160 and collector region 158 of the example NPN transistor, in accordance with embodiments. As shown in FIGS. 3A and 3B, the lateral current gains are more than 100 but the vertical current gains do not exceed 4 when the distance (D=2 μm, 3 μm, 4 μm, and 5 μm) of isolation between emitter region 160 and collector region 158 is approximately 3 μm, in accordance with embodiments.

Accordingly, in embodiments, electrons generated by the example NPN transistor do not substantially move the vertical direction.

Figure 3C:
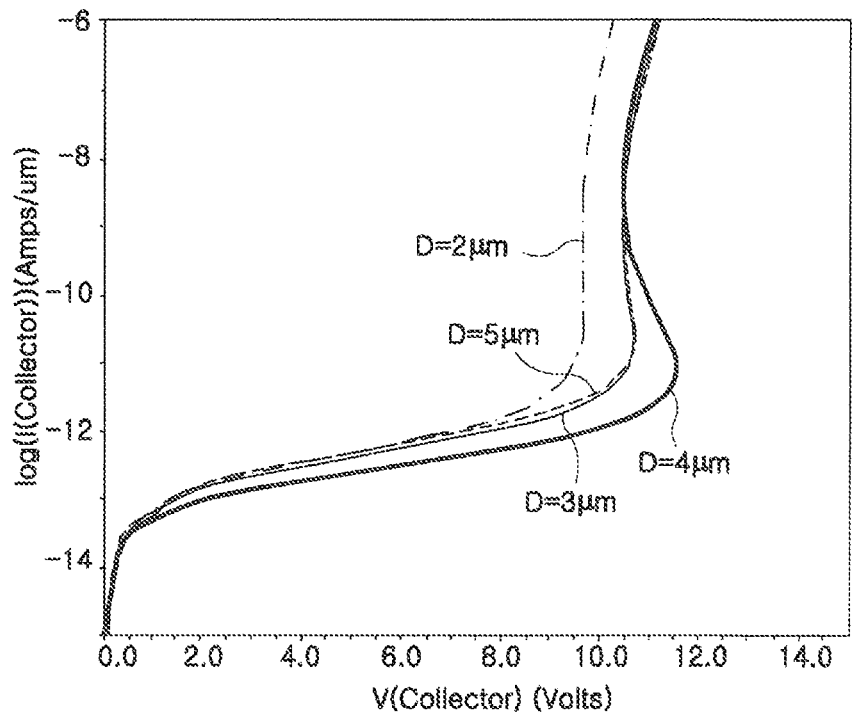
FIGS. 3C and 3D are graphs illustrating a breakdown voltage BVceo in a distance (D) isolated between the emitter region and the collector region, in accordance with embodiments.
Figure 3D:
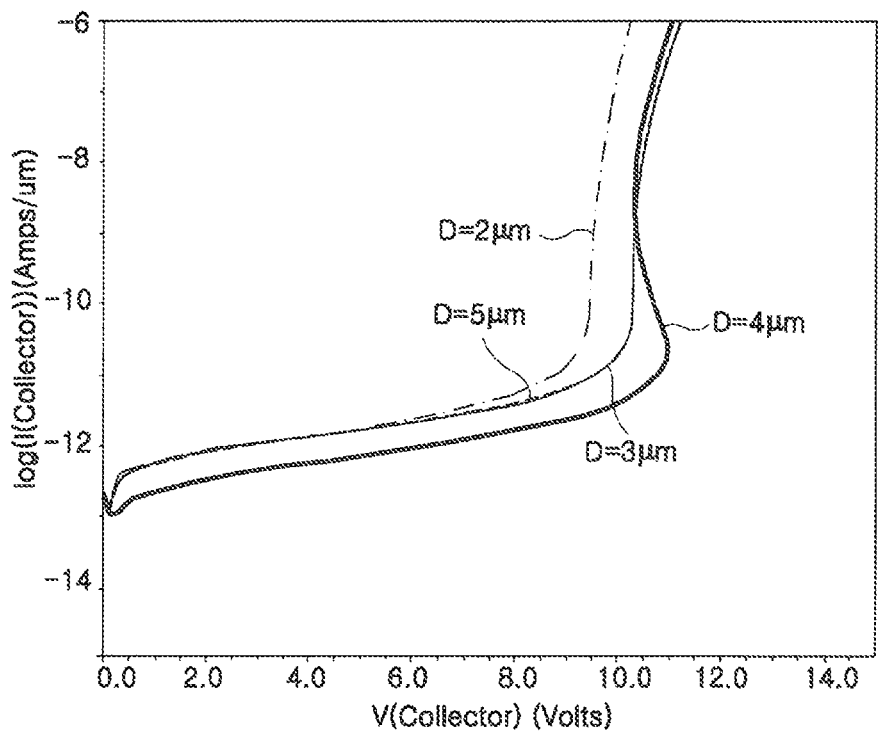

FIGS. 3C and 3D are graphs illustrating a breakdown voltage BVceo obtained by varying a distance (D=2 μm, 3 μm, 4 μm, and 5 μm) of isolation between emitter region 160 and collector region 158 of an example BiCMOS power semiconductor device, in accordance with embodiments. It may be appreciated by one of ordinary skill in that art that the example NPN transistor may satisfy conditions of operation in the horizontal direction within a logic operation voltage level, because the breakdown voltage BVceo exceeds 10V.

Figure 4B:
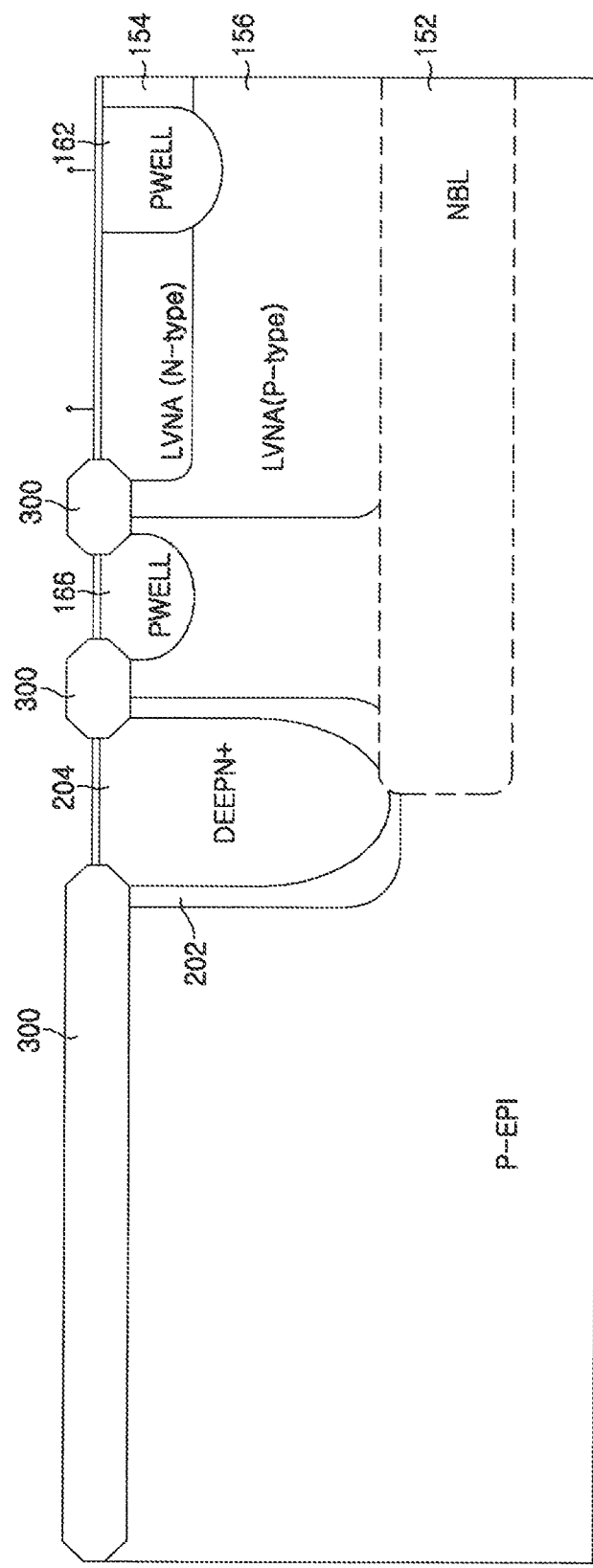
Figure 4C:
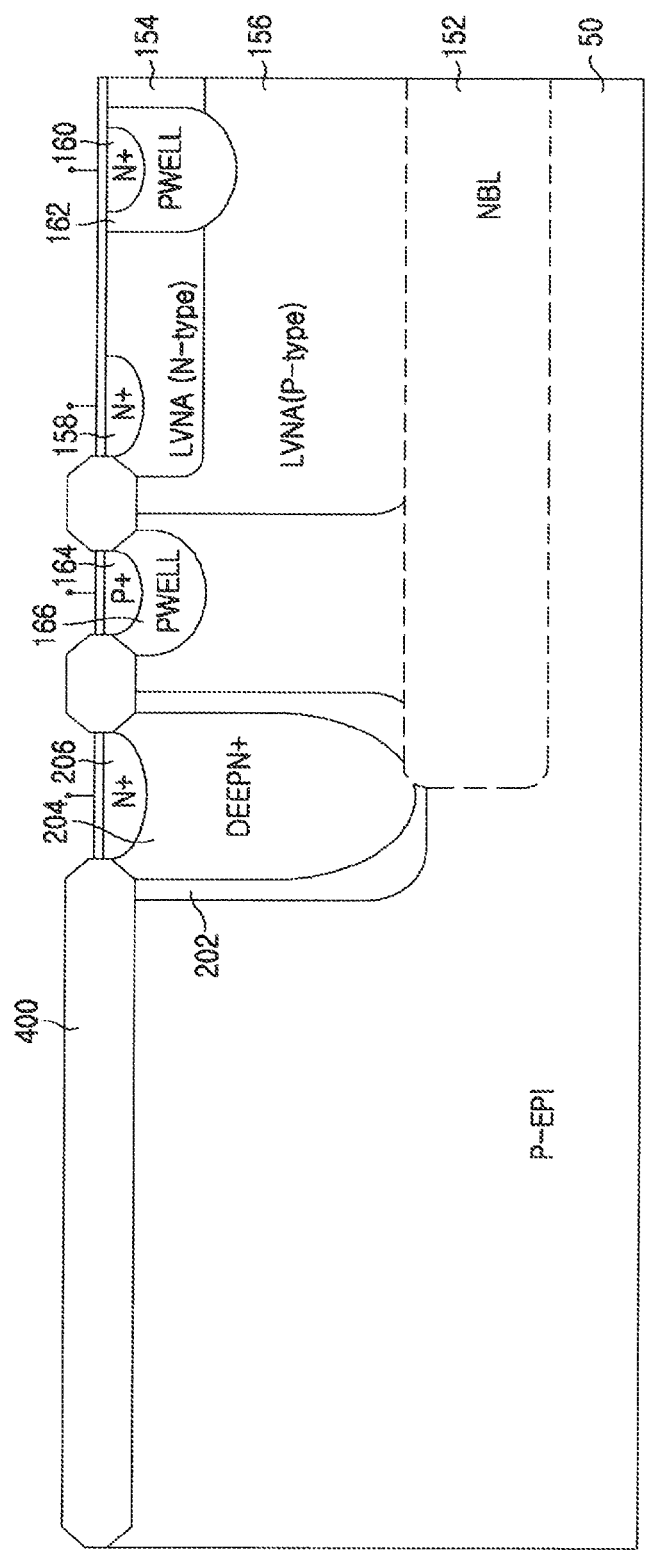

A process of forming a BiCMOS power semiconductor device, in accordance with embodiments, is illustrated in FIGS. 4A to 4C. In embodiments, a LDMOS transistor may have substantially the same structure as disclosed in FIG. 1 and the accompanying description of the related art. Accordingly, a process of forming a BiCMOS power semiconductor device in accordance with embodiments will focus on the formation of the NPN transistor and the guard ring.

FIGS. 4A to 4C are cross sectional views illustrating a process of forming a BiCMOS power semiconductor device, in accordance with embodiments. As illustrated in FIG. 4A, epitaxial layer 50 of a first conductive type (e.g. P-type of impurity ions) may be grown on/over a semiconductor substrate, in accordance with embodiments. A second conductive type (e.g. N-type) impurity ions may be implanted into epitaxial layer 50 of first conductive type, thereby forming buried layer 152 of the second conductive type. A portion of epitaxial layer 50 of the first conductive type may be exposed and second conductive type impurity ions for forming a guard ring may be implanted into the exposed region, thereby forming well 202 of the second conductive type having a relatively high concentration. In embodiments, a diffusion process or an ion implantation process using phosphorous oxychloride ($POCl_3$) may be carried out to form high-doped deep sink region (DEPN+) 204 of the second conductive type within second conductive type well 202.

A photo-resist pattern may be formed to expose regions of epitaxial layer 50, including regions for forming collector region 158 and emitter region 160, in accordance with embodiments. A process of implanting impurity ions of the first conductive type may be carried out with respect to the region exposed by the photo-resist pattern to implant the first conductive type impurities into epitaxial layer 50 on/over buried layer 152 of the second conductive type, thereby forming second extension region (LVNA) 156. In embodiments, the same ion implantation mask (i.e. photo-resist pattern) may be used to carry out a process of implanting impurity ions of the second conductive type so as to implant the second conductive type impurities into epitaxial layer 50 exposed by the photoresist pattern, thereby forming first extension region (LVNA) 154. In embodiments, first extension region 154 and second extension region 156 may be formed based on a size of the exposed surface of the photo-resist pattern and formed through a drive-in process. The photo-resist pattern may be removed by an ashing or strip process.

As illustrated in FIG. 4B, field oxide films 300 may be formed to expose portions of epitaxial layer 50 (e.g. an active region and a field region), in accordance with embodiments. In embodiments, a process of implanting impurity ions of the first conductive type may be performed on the regions exposed by field oxide films 300, thereby forming well junction 162 of the first conductive type and a first conductive type well (PWELL) 166.

As illustrated in FIG. 4C, a process of implanting a high concentration of impurity ions of the first conductive type into an inner region of the well of first conductive type 166 is carried out to form base region 164, in accordance with embodiments. High concentration impurity ions of the second conductive type may be implanted into a portion of first extension region 154 so as to form collector region 158 and emitter region 160. In embodiments, the high concentration impurity ions of the second conductive type may be implanted into deep sink region 204 to form impurity layer 206 of second conductive type. During ion implantation, emitter region 160 may be formed within well junction 162. In embodiments, distance (D) of isolation between collector region 158 and emitter region 160 may be between approximately 2.5 μm and 3.5 μm. In embodiments, distance (D) may be approximately 3 μm. Those of ordinary skill in the art will appreciate other parameters for distance (D) within the scope of embodiments.

Accordingly, in accordance with embodiments, a guard ring may be formed between a LDMOS transistor and a NPN transistor, which may restrain electrons generated by the forward bias operation of the LDMOS transistor from moving toward the NPN transistor. In embodiments, electrons generated from emitter region 160 may be restrained from moving in a vertical direction by virtue of first extension region 153, which is not connected to buried layer 152, second extension region 154, and first conductive type well junction 162 (formed below the emitter region 160). In embodiments, second extension region 154 has a contact surface with buried layer 152 and may be formed through the first conductive type impurity ion implantation process.

While embodiments have been shown and described, it will be understood by those skilled in the art that various changes and modification may be made without departing the scope of the embodiments as defined in the following claims.

What is claimed is:
1. A semiconductor device, comprising:
 a laterally double diffused metal oxide semiconductor (LDMOS) transistor formed on a first portion of an epitaxial layer, wherein the epitaxial layer is a first conductive type;
 a bipolar transistor formed on a second portion of the epitaxial layer; and
 a guard ring formed between the first portion of the epitaxial layer and the second portion of the epitaxial layer, wherein the guard ring substantially prevents electrons generated by a forward bias operation of the LDMOS transistor from moving into the bipolar transistor when an isolation voltage is applied to the guard ring,
 wherein the bipolar transistor comprises:
   a buried layer of a second conductive type, wherein the buried layer is connected to the guard ring,
   a second extension region of the first conductive type having a contact surface with the buried layer, the second extension region is formed through a ion implantation of a first conductive type impurity,
   a first extension region of the second conductive type formed within the second extension region, wherein the first extension region includes a collector region and an emitter region, and
   a base region formed between the guard ring and the second extension region.
2. The device of claim 1, wherein the first conductive type comprises P-type impurities.
3. The device of claim 1, wherein the guard ring comprises:
 a high-voltage well of a second conductive type, wherein the polarity of the second conductive type is opposite to the first conductive type;

a second conductive deep sink region formed within the high-voltage well; and an N-type impurity layer formed within the second conductive deep sink region.

4. The device of claim 3, wherein the second conductive type comprises N-type impurities.

5. The device of claim 1, wherein the bipolar transistor includes a well junction of the first conductive type formed below the emitter region and connected to the second extension region.

6. The device of claim 1, wherein the emitter region and the collector region are formed to be isolated by a distance between approximately 2.5 µm and 3.5 µm.

7. The device of claim 1, wherein the bipolar transistor further includes a well of the first conductive type formed below the base region.

8. The device of claim 1, wherein the second extension region and the first extension region are formed by a drive-in process.

* * * * *